Nov. 12, 1968 J. W. SHEPARD ET AL 3,410,767

ELECTROGRAPHIC REPRODUCTION PROCESS

Original Filed May 29, 1961

INVENTORS
JOSEPH W. SHEPARD
BENJAMIN L. SHELY
BY
Carpenter, Abbott, Coulter & Kinney
ATTORNEYS United States Patent Office 3,410,767
Patented Nov. 12, 1968

3,410,767
ELECTROGRAPHIC REPRODUCTION PROCESS

Joseph W. Shepard, St. Paul, and Benjamin L. Shely, White Bear Lake, Minn., assignors to Minnesota Mining and Manufacturing Company, St. Paul, Minn., a corporation of Delaware Original application May 29, 1961, Ser. No. 113,480, now Patent No. 3,172,828, dated Mar. 9, 1965. Divided and this application Jan. 15, 1965, Ser. No. 425,830
10 Claims. (Cl. 204—18)

ABSTRACT OF THE DISCLOSURE

A process for making an electrographic reproduction using a radiation-sensitive sheet containing a P–N plane junction in which process the radiation-sensitive sheet is exposed to a light image while maintaining a reverse bias direct current field on said sheet with respect to said junction.

Figure 1:
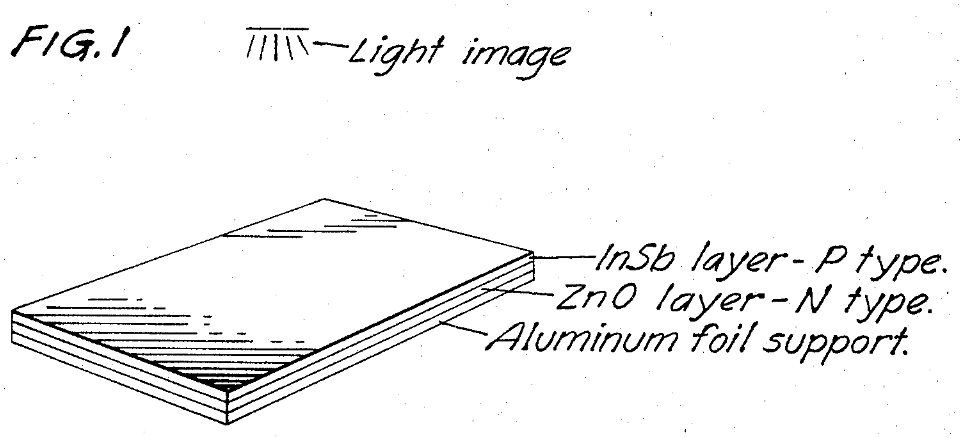

This application is a division of our prior and copending application Ser. No. 113,480, filed May 29, 1961, now Patent No. 3,172,828.

The present invention relates to a new and useful radiation-responsive element. In one aspect this invention relates to a new photoelectric cell. In another aspect the invention relates to a new reproduction receptor surface, such as a copysheet, and a process for using same.

One of the most recently developed methods for the reproduction of images utilizes a receptor surface containing a photoconductor which is exposed to a radiation pattern to be reproduced and is thereafter electrolytically developed. One form of a reproduction surface is a copysheet upon which has been deposited a metal layer and upon which metal layer has been bonded with an insulating resin a photoconductor, such as zinc oxide. This sheet is then exposed to a light pattern or image and then electrolytically developed. The electrolytic development is accomplished by connecting the negative pole of a direct current source to the metal layer of the sheet. A liquid solution containing an electrolyte and a developer material is contacted with the exposed surface of the copysheet and the positive pole of the direct current source is connected to the electrolytic solution. Electrolysis is effected in the solution, resulting in an imagewise deposit on the surface of the copysheet. The theory behind the process involves the change in conductivity of the photoconductor upon exposure to light. The pattern formed by the light-struck areas is more conductive than the non-light-struck areas. Therefore, when an electrolytic solution contacts the surface during development, the current passes during electrolysis through the light-struck areas of the photoconductor. The developer solution may contain a metal salt which is reduced and the metal or a metal compound is deposited upon the light-struck areas due to the electrical current.

One of the controlling factors in the successful operation of the electrolytic process is the resistance of the receptor laminate containing the photoconductor to the passage of current during electrolysis, especially at voltages above 50 volts. In order to produce a receptor having a sufficiently low resistance for the electrolytic development of the reproduction, special photoconductors of high photoconductivity are used. These photoconductors are characterized by the fact that a surface-coated receptor has a conductivity of about $10^{-7}$ mho/cm. in the light, or greater (measured at 1300 foot-candles with aqueous electrolyte electrode for 5 seconds). Photoconductors which provide a receptor of such conductivity are usually satisfactory for the electrolytic process when using relatively low voltages. The correlation of the conductivity of the photoconductor and the thickness of the photoconductive coating is necessary to provide a minimum of resistance to the passage of electrical current during electrolysis. It is much to be desired, therefore, to provide a receptor construction which will reduce this resistance and provide increased differentiation between the resistance of light-struck areas and non-light-struck areas.

In addition, the photoconductors which are usable as the surface coating on the receptor for an electrolytic process are preferably of the N-type, and, therefore, characteristically may rectify the current during electrolytic development unless the receptor is made the negative pole and the electrolytic solution the positive pole. This type of a cathodic reproduction of the image is characteristic of the electrolytic process with certain photoconductors. Connecting the receptor with the positive pole and the electrolytic solution with the negative pole usually results in an unsatisfactory process because rectification causes increased resistance to the flow of the electrical current. Although current may flow under anodic development, generally the time required is excessively long and the differentiation between the light-struck areas and non-light-struck areas is such as to cause a poor, if any, image reproduction. It is, therefore, much to be desired to provide a receptor construction which will minimize or eliminate this rectification effect and thus permit anodic development as well as cathodic development of the image on the receptor.

The object of this invention is to provide a new radiation-responsive element.

Another object of this invention is to provide a photoconductive receptor material or copysheet which is capable of development by an electrolytic process.

Still another object is to provide a new and improved photoconductive receptor of increased conductance or sensitivity and increased light response rate.

Yet another object is to provide a photoelectric cell.

Another object is to provide a photoconductive receptor of increased difference in conductivity between light-struck and non-light-struck areas.

Another object of this invention is to provide a process for the electrolytic development of a latent reproduction.

Still another object of this invention is to provide an anodic process for the electrolytic development of a latent reproduction.

Various other objects and advantages of the present invention will become apparent to those skilled in the art from the accompanying description and disclosure.

The radiation-responsive element of this invention comprises a supporting surface upon which has been deposited both an N-type semiconductive layer and a P-type semiconductive layer to form a junction between the two types of semiconductive layers. Preferably, at least one of said semiconductive layers is photoconductive and both layers may be photoconductive without departing from the scope of this invention. The semiconductive layers may be covered by additional layers of coloring material, such as dyes, carbon black and titanium dioxide, conductive material, or an additional photoconductive or semiconductive material. In such case, the covering layer or layers are of such thickness or transparency that the covering layers are penetrated by the irradiation to which the element is exposed as the result of which the junction is activated by the irradiation. The semiconductive layers are separately connected to, or are in contact with, suitable electrical conductors.

The junction between the N-type semiconductive layer and the P-type semiconductive layer is in the form of a plane parallel to the supporting surface. The junction is formed first by depositing one semiconductive layer overlying the supporting surface, then depositing the second semiconductive layer coextensively overlying the first semiconductive layer forming the plane junction.

The supporting surface is preferably in the form of a sheet or plate, and still more preferably, is in the form of a paper like structure. The support may constitute one of the electrical contacts made with the semiconductive layers, such as when the support is metal foil or a thin layer of metal deposited on plastic film or paper.

The combination of an N-type semiconductor and a P-type semiconductor (one of which is photoconductive) to form a plane junction results in an increased rate of light response or increased conductance for the same radiation intensity and for the same exposure time. The increase in conductance of the receptor for short exposure times as compared to the use of a single photoconductive layer permits the use of higher voltages and consequently higher current flow without current leakage. In use in an electrolytic development process, this results in shorter development times and higher contrast.

In accordance with a preferred embodiment of this invention, the radiation-responsive element in the form of a receptor sheet is utilized to reproduce an image or pattern by exposing the receptor sheet to a radiation pattern or light image and by electrolytically developing the resulting latent image or pattern on the receptor sheet, either cathodically or anodically. The receptor sheet comprises a semiconductive layer bonded or affixed to a continuous metal layer or substrate. This first layer in contact with the metal layer may be, for example, a semiconductive layer of the P-type which is not substantially photoresponsive. The metal substrate may be bonded or affixed to a nonconductive backing, such as synthetic plastic film, but this is not always necessary in every case. Overlying this first semiconductive layer on the sheet is bonded a second semiconductive layer comprising a semiconductor of different type than that of the first layer; for example, an N-type photoresponsive semiconductor. The nonphotoconductive semiconductive layer should preferably have greater conductance than does the photoconductive layer under irradiation. In any case, the nonphotoconductive layer must not have greater resistance than the photoconductive layer under dark adapted conditions. The above is obtained by the proper choice of semiconductive materials and their manner of deposition on the substrate. A particularly useful photoresponsive element comprises a bottom or first semiconductive layer of P-type indium antimonide (InSb) and a top or second layer of N-type photoconductive zinc oxide. In some instances, both layers forming the P–N junction may be nonphotoconductive since the junction itself becomes photoresponsive. Various sequences of N-type and P-type semiconductive layers may be used to form the junction of the radiation-responsive element without departing from the scope of this invention.

Figure 2:
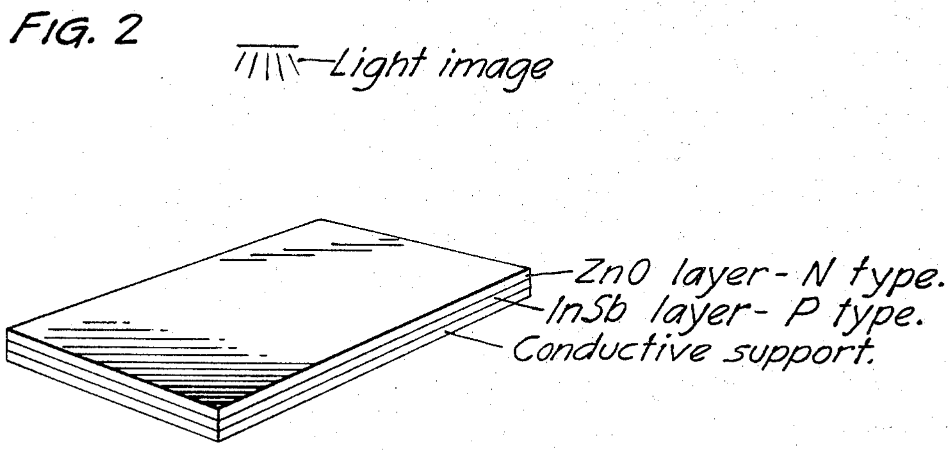
Figure 3:
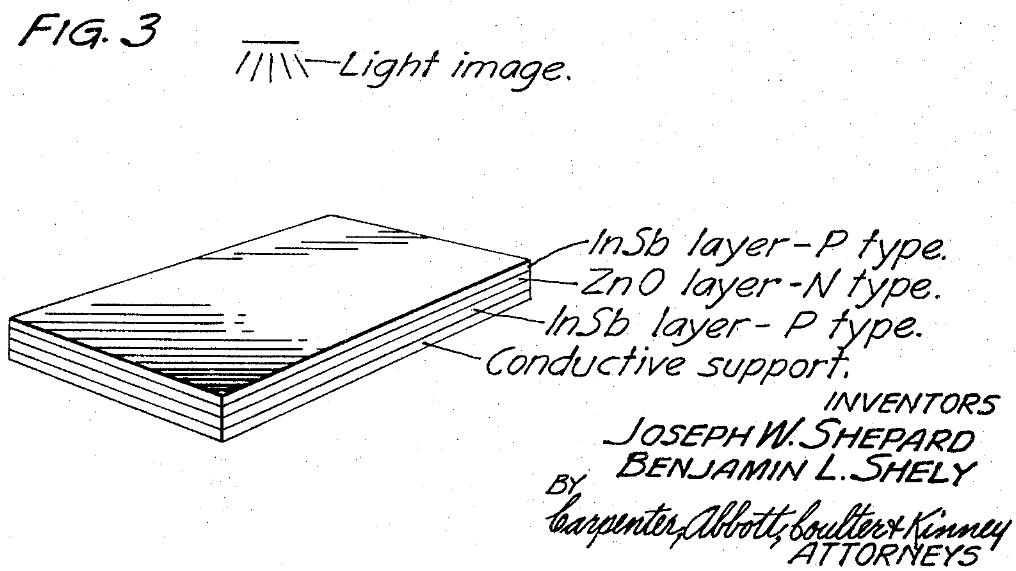

FIGURES 1 through 3 of the drawing are diagrammatic illustrations of sheet constructions useful in accordance with this invention. In all instances, the P–N junction must be accessible to radiation, such as actinic light. Also, it is often desirable to have the construction such that the photoconductive layer, itself, is accessible to radiation. In FIGURES 1 to 3 the support constitutes one electrical contact or electrode and the other electrode must be provided on the top or outer layer, such as by an electrolytic solution, a transparent plate electrode, such as "NESA" glass, or a gelatin layer or surface containing an electrolyte. In FIGURES 1 and 3 the top semiconductive layer must be sufficiently thin to permit at least 10 percent light transmission to the junction or the adjacent photoconductive zinc oxide layer. In the construction of FIGURE 3, the photoconductive layer of zinc oxide should be sufficiently thin to permit diffusion of charge carriers across the layer to the junctions. In the construction of FIGURE 1, the electrical contact to the top or outer layer must be negative. The electrical contact made to the top layer of the construction of FIGURE 3 can be either positive or negative. In the construction of FIGURE 2, the electrical contact to the photoconductive zinc oxide top layer should be positive.

Most semiconductors may be applied to the supporting surface by vapor deposition to form the separate layers. Also the layers can be formed from a mixture of a semiconductor in particulate form in combination with an insulating organic binder and an organic solvent. The solvent is evaporated, leaving the particulate semiconductor in a binder matrix as a continuous surface layer.

Suitable normally N-type semiconductors include zinc oxide, indium oxide, gallium arsenide, cadmium telluride, cadmium sulfide and mercuric oxide. All of these are sufficiently photoconductive to be used also as the photoconductive layer. The conductivity of these N-type photoconductors in layer form is about $10^{-7}$ mhos/cm., or greater, in the light (measured at 1300 foot-candles of light with an aqueous electrolyte electrode for 5 seconds). P-type semiconductors include indium antimonide, gallium arsenide, silicon, germanium and cadmium telluride. These latter semiconductors contain an impurity or doping agent to make them P-type semiconductors. Indium antimonide contains zinc as a doping agent to make it P-type. P-type silicon and germanium contain gallium or aluminum as doping agents. P-type cadmium telluride contains copper as a doping agent. Gallium arsenide contains zinc to make it P-type. P-type cadmium telluride is sufficiently photoconductive to be used as the photoconductive layer.

The metal layer, when used, may be sufficient as a self-supporting layer for the other layers of the receptor or may be bonded or affixed to a backing or support for insulation purposes. Foils or films of metal are suitable as a self-supporting metal layer. When a backing it utilized, the metal is deposited upon the backing or adhered thereto in the form of a film or foil. The metal layer may be deposited on the backing by vapor deposition, electroplating, precipitation, or by bonding metal foil or metal particles thereto with a suitable binder. Conductance of the metal layer is important since the metal layer is used as one of the electrodes. Therefore, the metal layer should offer no more lateral or surface resistance than about 10,000 ohms, preferably no more than 20 ohms, per square, and preferably the metal layer should be in ohmic contact with the adjacent semiconductor layer. The thickness of the meal layer, of course, will depend upon whether it is the support itself, or whether it is utilized merely as the electrode. When the metal layer is utilized upon a nonconductive backing, the thickness of the metal layer is usually between about 0.01 and about 25 microns. Suitable backing material for this metal layer is wood pulp paper, rag content paper and synthetic plastic films, such as cellulose acetate films, "Mylar" (polyethylene terephthalate) films, polyethylene films and polypropylene films. Even cotton or wool cloth may be utilized as the backing without departing from the scope of this invention. Suitable metals for the metal layer include aluminum, tin, chromium, silver and copper.

When the bottom layer of the semiconductor adjacent the substrate is highly conductive, the use of a metal layer may be omitted and the electrical connection may be made directly to the semiconductor layer. Such semiconductors as silicon and indium antimonide are sufficiently conductive for this purpose because in their doped form, the surface resistance of such layers is less than about $10^4$ ohms per square.

As previously mentioned, insulating resinous binders are utilized to bond the semiconductor particles together as well as to bind the semiconductive layers to the supporting surface and to each other. The preferred resinous bonding agents are those which are no more conductive than the semiconductor and the photoconductor under dark conditions (in the absence of radiation). The resinous binder should also preferably have a low degree of wettability toward the photoconductive and semiconductive particles. Suitable binders include the copolymer of styrene and butadiene (in a mol ratio of about 70:30) known as "Pliolite" S–7, polystyrene, chorinated rubber ("Parlon"), rubber hydrochloride, polyvinyl chloride, nitrocellulose and polyvinyl butyral. The weight ratios of binder to semiconductive particles generally range from 1:10 to 1:1; preferably 1:5 to 1:2.

Sensitizing dyes may be incorporated with the photoconductive layer to enhance the response of the receptor to actinic light. Suitable dyes for this purpose include the phthalein dyes of xanthene class, such as Eosin (CI 45,380), "Erythrosin" (CI 45,430) and Uranine (CI 45,350); thiazole dyes such as "Seto" Flavin-T (CI 49,005); sulfur dyes such as Calcogene Yellow 2GCF (CI 53,160); quinoline dyes such as Calcocid Yellow 5GL (CI 29,000); and the acridine dyes such as Phosphine-R (CI 46,045). The dyes may be used singly or in combinations of two or more dyes. A particularly good combination is Eosin and "Seto" Flavin-T. An amount of dye or dyes between about 0.01 and about 0.2 weight percent, based on the photoconductor, is satisfactory. The dyes are applied singly or in combination to the photoconductor from solutions such as from a solution of ethyl acetate.

In preparing the respective photoconductive and semiconductive layers, mixtures of two or more photoconductors or two or more nonphotoconductive semiconductors of the same type may be utilized without departing from the scope of this invention. Similarly, two or more binders may be used in admixture.

The photoconductive receptor of this invention is suitable for reproduction of an image by exposure of the receptor to a radiation pattern or light image. The radiation may be actinic light, ultraviolet light, X-rays and gamma rays. As a result of exposure to the radiation pattern or light, a differentially conductive pattern is formed on the receptor surface by virtue of the increased conductance of the photoconductor or the junction in the light-struck areas. The difference in conductance of the irradiated areas as compared to the nonirradiated areas is at least 10 times, and generally as much as 100 times, or greater.

The surface of the exposed receptor is contacted with an electrode, such as an aqueous solution containing an electrolyte. A direct current voltage is impressed across the electrolytic solution and the receptor while the receptor is in contact with a developer material which results in the reproduction of the image or pattern. This may be done simultaneously with the exposure step, or as a subsequent step, since the receptor sheet generally has a "memory" of several seconds, or more. In many instances, the developer itself constitutes the electrolyte and no added electrolyte is necessary. In other instances, the liquid or solution, by virtue of its source, will contain an electrolyte. In case it is necessary to add an electrolyte to the solution, suitable electrolytes, such as sodium chloride, sodium carbonate, sulfuric acid, acetic acid or sodium hydroxide may be used.

Best results are obtained if a reverse bias (with respect to the junction) direct current field is applied across the receptor during the exposure step and is continued without interruption through the development step. Such a reverse bias field increases the differentiation between the light conductance and the dark conductance and increases the response rate. The positive pole is, in effect, connected to the N-type semiconductive layer, and the negative pole is connected to the P-type semiconductive layer. With a receptor comprising a metallic base layer in which the top layer is of the N-type and the sublayer is of the P-type, and on which the exposed latent image is to be developed electrolytically, the base metal of the receptor is the negative electrode during both exposure and development. The electrolytic solution may constitute the connection to the positive electrode during both exposure and development. Exposure in such instances is carried out in a transparent electrolytic cell with either a transparent or ring-type positive electrode positioned in the cell in front of the receptor. The electrolyte may be in the form of a transparent gel layer containing a dissolved electrolyte. In such a setup, the receptor is under reverse bias with regard to the junction, and under nonrectifying conditions with regard to the semiconductor layer-electrolyte interface.

The development may be carried out either anodically or cathodically, depending upon which type of semiconductor constitutes the interface surface with the electrolyte. In other words, the receptor may be connected to the positive or negative source of direct current without departing from the scope of this invention. Cathodic development is usually used when the semiconductor interface with the electrolyte is of the N-type, and anodic development is usually used when the interface is of the P-type. When the top layer is sufficiently conductive, either anodic or cathodic development can be used.

Metal plating by electrolysis is a typical example of cathodic electrolytic development of an image. In such instances, a suitable metal salt is dissolved in water and the surface of the receptor contacted with the aqueous solution, such as by inserting the receptor in a vessel containing the aqueous solution or by brushing the solution on the surface with a sponge or gelatin roller or the like, which is connected to a direct current source. Suitable metal salts which act both as an electrolyte and the source of metal for plating or deposition of a metal compound on the surface include copper sulfate, silver nitrate, silver chloride, nickelous chloride, zinc chloride, etc.

Other developer materials may similarly be utilized in the cathodic development of the image. For example, diazonium salts plus coupler materials in acidified water and diazotizable amines and coupler materials in water may be used. Also the surface of the receptor may be treated with a suitable reducible dye, such as methylene blue, which is reduced during electrolysis.

As an example of anodic development, the receptor is made the positive pole and the exposed surface is contacted with an aqueous latex containing negatively charged polymer particles, such as polyethylene and polypropylene, or a hydrosol of such materials as aniline blue and indigo. The aqueous latex or hydrosol is connected to the opposite or negative pole. Those polymer latices which are stable in alkaline media usually contain negatively charged particles and are, therefore, operable in the anodic type of operation of the present invention. In this type of operation, the negatively charged particles are deposited selectively on the latent image pattern during electrolysis. Reproduction may be made on a white surface when the polymers of the latex contain a dye or coloring matter, such as a pigment. On black receptor surfaces, the polymer of the latex is usually white, and a positive is thereby produced directly. These reproductions employing a latex for the development are also useful as lithographic plates since the light-struck areas containing the polymer thereon are hydrophobic.

Among other developers which may be used in the anodic process are substances capable of changing color on oxidation, such as the leuco form of vat dyestuffs used in the dyeing of various commercial fibers. For example, if the anodic process is carried out with indigo white in contact with the exposed surfaces of the receptor, the anodic reaction oxidizes indigo white from its colorless lueco form to insoluble colored indigo in the conductive surface areas. The final visible image is found to be stable except for the tendency to fade slowly, probably because of the oxidation of the lueco dye on exposure to air. These dyestuffs can be incorporated into the electrolytic solution or may be coated on the receptor surface prior to electrolysis.

Still another developer material that may be employed in the anodic development process is the colored anion, as exemplified by the acid-type dyestuffs. By carrying out the electrolysis with the photosensitive sheet as the anode and with an acid-type dyestuff in the electrolytic solution, the colored anions of the acid-type dye migrate selectively to the conductive image areas and are deposited thereon, thereby coloring the light-exposed surface areas. These dyes are commonly marketed in the form of a salt of their sulphonic acid, usually the sodium salt. Illustrative of such developers are the nitro dyestuffs, such as Naphthol Yellow (CI 10,315); the monazo dyestuffs such as Fast Red (CI 15,620); the diazo dyestuffs such as Crocein Scarlet (CI 27,155); the nitro dyestuffs such as Naphthol Green (CI 10,020); the triphenylmethane dyestuffs such as Wool Green (CI 44,090); the xanthene dyestuffs such as Erio Fast Fuchsine BL (CI 45,190); the orthraquinone dyestuffs such as Solway Blue SES (CI 6300); the azine dyestuffs such as Azocarmine (CI 50,085) and the quinoline dyestuffs such as Quinoline Yellow (CI 47,005). Although some color is often deposited in the background areas, when the colored anion containing electrolyte is brought into contact with the exposed photosensitive sheet surface, the depth of color is significantly greater in the light-struck areas and the contrast can be controlled by selection of the colored anion, concentration of colored anion in the electrolytic solution, duration and conditions of the electrolysis, etc.

The current necessary for development of the image by electrolysis is usually between about 1 and about 100 milliamperes per square centimeter. In general, the voltage required to give such a current through the electrolytic solution and receptor is between about 3 and about 100 volts, usually between 10 to 60 volts per mil thickness of coating. The time required to produce the visible reproduction by electrolysis is between about 0.1 second and about 1 minute, depending upon the current and the developer material utilized.

The following example illustrates the method and construction of the receptor and the use of the receptor in the reproduction of an image or pattern in accordance with this invention.

EXAMPLE

In the following example, different photo responsive receptors were prepared and tested and utilized for the reproduction of an image. The dark and light conductivity as well as the response rate of the different constructions are compared with a standard single layer metal laminate photoresponsive construction as a control. The nine constructions were prepared in the following manner:

Construction I

In this construction, the insulating backing or substrate utilized as the support for the receptor was a 3-mil thick "Mylar" film, 4 inches x 5 inches in dimension. On to this substrate was affixed a 0.05-mil thick aluminum layer by vapor deposition in conventional manner. The aluminum layer was thoroughly cleaned with a suitable solvent, such as isopropanol. On to this aluminum layer "Mylar" laminate was affixed two separate overlying layers.

The first layer was adhered directly to the aluminum surface and was a layer of vapor-coated indium antimonide. The second overlying layer was affixed directly to the indium antimonide layer and constituted the top or surface layer. This last layer was a zinc oxide layer.

The vapor coating of indium antimonide was accomplished in a 20-inch diameter experimental bell jar. The samples to be vapor-coated were mounted on a rotating cage approximately 16 inches from the outgassed evaporating source. The source was a molybdenum boat with dimensions of 1⅞ inches x ⅞ inch x 0.15 inch. The bell jar was previously evacuated to approximately $10^{-5}$ mm. of mercury, and the molybdenum boat was outgassed at approximately 1000° C. for 5 minutes, then cooled in vacuum for 30 minutes prior to coating.

The jar was opened, and freshly cleaved indium antimonide particles were placed in the outgassed molybdenum boat. The indium antimonide particles were obtained from crushed P-type polycrystalline material with a maximum carrier concentration (at 80° K.) of $2\times10^{19}/cm.^3$. The indium antimonide particles were cleaned by etching, rinsing in alcohol, followed by drying to remove surface oxide before vapor coating. The aluminum "Mylar" laminates to be coated were placed on the rotatable cage and the jar evacuated. The glow discharge was turned on for 10 minutes at this point, while the pressure was maintained at 10–20 microns by a controlled leak-needle valve. Then the system was pumped to approximately $0.3\times10^{-5}$ mm. of mercury, and the rotating cage was turned on to facilitate a consistent and uniform coat on all samples. The heating source was raised to temperature by setting the current-indicating meter to a reading of 2 amperes (secondary voltage of 4 volts) for 3 minutes to outgas the indium antimonide surface. The temperature of the source rose rapidly; current meter indicated 6 amperes to flash off the indium antimonide rapidly. The substrate was not heated, but remained at the residual bell jar temperature.

Coating thickness ranged between 10 and 50 percent transmission (using a tungsten light source). The thickness can be monitored during coating and can be maintained to ±3 percent transmission of a selected point between 10 and 50 percent. The coating thickness is not so critical on the intermediate layer because light penetration of this layer is usually unnecessary. However, when this technique of deposition or any other technique is utilized, as in the following constructions, for the top layer, the layer should be sufficiently thin for light penetration. It was determined that the coated layer was P-type by thermoelectric measurements, and the surface or lateral resistance was about $10^4$ ohms per square, and usually would range between $10^2$ to $10^5$ ohms per square. Unless the above procedure is followed, an undesirable multiple phase layer is obtained.

The indium antimonide vapor coated sheet was top coated with a zinc oxide slurry. The coating was accomplished on a motor driven knife coater, with the orifice set on 1.5 to 2.0 mils, resulting in a dry thickness of 0.5 to 0.7 mil.

A zinc oxide slurry as indicated below was prepared by the following technique.

Ingredients of zinc oxide slurry:
- ZnO—USP-12 (dark adapted at least 24 hours)
- "Pliolite" S-7 (copolymer of styrene and butadiene) 30% in toluene (purified over silica gel)
- Polystyrene PS-2—30% in toluene (purified over silica gel)
- Eosin (CI 45380)—2% in ethyl alcohol (purified)

"Seto" Flavin-T (CI 49,005)—2% in ethyl alcohol (purified)
Toluene—reagent grade All mixing, milling and coating operations were done in subdued red light or absolute darkness to achieve maximum sensitivity. First, 50 grams of USP-12 ZnO (photoconductivity about $10^{-7}$ mhos./cm. in layer form at 1300 foot-candles, wet test), 0.05% each of Eosin and "Seto" Flavin-T and 37.9 grams of toluene were mixed and allowed to stand in the dark overnight. Then 18.2 grams of "Pliolite" S–7 in toluene and 12.1 grams of polystyrene PS–2 in toluene were added to the original mixture. The pint jar containing the above mixture was filled about half full with ⅜-inch glass balls. A milling time of 4 hours followed. The slurry was coated out immediately after milling in the manner described above. The sample was allowed to air-dry for at least 24 hours before testing or using as an electrophotographic paper. The transverse conductance through the zinc oxide layer was about $10^{-4}$ mhos./sq. in. in the light (10 foot-candles tungsten source as hereinafter described). The light transmission of the resulting N-type top zinc oxide layer was about 20 percent. The paper should never be exposed to light until ready for use, in order to maintain maximum sensitivity.

Construction II

This construction was substantially the same as Construction I except that the indium antimonide and the zinc oxide layers are reversed. The construction comprised a flexible "Mylar" backing, an aluminum layer overlying and attached to the "Mylar" backing, a zinc oxide layer overlying and affixed to the aluminum layer, and a last or top layer of indium antimonide overlying and affixed to the zinc oxide layer.

The zinc oxide layer was prepared and affixed to the aluminum layer in substantially the same manner as described in Construction I from a slurry of zinc oxide in a binder. The indium antimonide layer was laid upon the dried zinc oxide layer in substantially the same manner as described in Construction I by vapor deposition. The characteristics of the zinc oxide layer and the indium antimonide layer of Construction II were the same as in Construction I. The top indium antimonide layer had a light transmission of about 40 percent. The surface resistance of the indium antimonide layer was about $10^4$ ohms per square. The zinc oxide layer adjacent the aluminum layer was of N-type, and the indium antimonide layer or top layer was of the P-type. The thickness of the vapor-deposited indium antimonide layer was at least 1000 times less than the slurry-coated zinc oxide layer.

Construction III

This construction comprised a "Mylar" backing having affixed thereto an aluminum layer. Adhered to and overlying the aluminum layer was a P-type indium antimonide layer, and adhered to and overlying the indium antimonide layer as the outer layer of the construction was an N-type cadmium sulfide layer. This construction was prepared in a manner similar to Construction I. The aluminum layer and the indium antimonide layer were affixed to the "Mylar" backing as described in Construction I and had the same characteristics and physical properties as regards Construction I. The cadmium sulfide outer layer was prepared and affixed to the vapor deposited indium antimonide intermediate layer as follows:

The indium antimonide vapor coated sheet was top coated with a cadmium sulfide slurry. The coating was accomplished on a motor driven knife coater, with the orifice set on 1.5 to 2.0 mils, resulting in a dry thickness of 0.5 to 0.7 mil.

A cadmium sulfide slurry was prepared by the following technique.

Ingredients of cadmium sulfide slurry:
CdS—N-type photoconductive powder
"Pliolite" S–7—30% in toluene (purified over silica gel)
Polystyrene PS–2—30% in toluene (purified over silica gel)
Toluene—reagent grade First, 50 grams of photoconductive cadmium sulfide, 18.2 grams of "Pliolite" S–7 in toluene, 12.1 grams of polystyrene PS–2 and 37.9 grams of toluene were placed in a pint jar previously half-filled with ⅜-inch glass balls. The cadmium sulfide was dye-sensitized to achieve greater sensitivity. Dyes such as kryptocyanine, Dicyanine A and Pinacyanol were used. The sample was milled for 24 hours. The slurry was coated out immediately after milling in the manner described in Construction I. The sample was allowed to air dry for at least 24 hours before testing or using as an electrographic paper. The light transmission of the cadmium sulfide layer was about 20% (tungsten source), and the layer had a resistance of about $3\times10^6$ ohms per square inch (conductivity of $1.5\times10^{-9}$ mhos/cm.) on irradiation with a 10 foot-candle tungsten light source in a manner as hereinafter described (dry test), and was of the P-type.

Construction IV

Construction IV comprised the following successive layers; a "Mylar" film backing, an aluminum layer overlying and attached to said "Mylar" film, an N-type cadmium sulfide layer overlying and attached to said aluminum layer, and a top or last layer of P-type indium antimonide overlying and attached to said cadmium sulfide layer. This construction was prepared in substantially the same manner as described in connection with Construction III except the cadmium sulfide and the indium antimonide layers were reversed. The cadmium sulfide layer was prepared and applied from a slurry. The indium antimonide layer was applied by vapor coating. The characteristics of the layers are substantially as described in Construction III.

Construction V

This construction comprised the following successive overlying layers: a "Mylar" film backing, an aluminum layer attached to said "Mylar" film backing, a P-type indium antimonide layer attached to said aluminum layer, and a top or last layer of N-type indium oxide attached to said indium antimonide layer.

The first three layers of the above construction were prepared and applied as described in Construction I. These layers had the same characteristics as the corresponding layers of Construction I. The N-type indium oxide layer was prepared and applied as the top layer from a slurry as follows:

The indium antimonide vapor coated sheet was top coated with an indium oxide slurry. The coating was accomplished on an experimental motor driven knife coater, with the orifice set on 1.5 to 2.0 mils, resulting in a dry thickness of 0.5 to 0.7 mil. The light transmission of this top layer was about 30 percent (tungsten source).

An indium oxide slurry was prepared by the following technique.

Ingredients of indium oxide slurry:
$In_2O_3$—N-type photoconductive powder (photoconductivity about $10^{-7}$ mhos/cm. as a layer @ 1300 foot-candles, wet test)
"Pliolite" S–7—30% in toluene (purified over silica gel)
Polystyrene PS–2—30% toluene (purified over silica gel)
Toluene—reagent grade
Methyl ethyl ketone—reagent grade First, 50 grams of photoconductive $In_2O_3$, 18.2 grams of "Pliolite" S–7 in toluene, 12.1 grams of Polystyrene PS–2 in toluene, 20 grams of methyl ethyl ketone and 17.9 grams of toluene were placed in a pint jar, previously half-filled with ⅜-inch glass balls. The indium oxide was dye-sensitized to achieve greater sensitivity. Dyes similar to those used with zinc oxide (as in Construction I) were used. The slurry was milled for 72 hours. The slurry was coated out immediately after milling in a manner described in Construction I. The sample was allowed to air dry for at least 24 hours before testing or using as an electrophotographic paper. The paper should never be exposed to light until ready for use in order to maintain maximum sensitivity. The transverse resistance through the indium oxide layer was about $2 \times 10^4$ ohms per square inch in the light (10 foot-candle dry test as hereinafter described).

Construction VI

Construction VI was prepared in the same manner as Construction V, except that the P-type indium antimonide layer and the N-type indium oxide layer were reversed. The indium oxide layer was applied to the aluminum layer from a slurry. The indium antimonide layer was applied to the indium oxide layer as a top layer by vapor deposition. The characteristics of the various layers are the same as those described in Construction V.

Construction VII

Construction VII comprises the following successive layers: a "Mylar" film backing, aluminum layer, P-type silicon layer, and an N-type zinc oxide top layer. The application of the aluminum layer to the flexible "Mylar" backing is the same as that described in Construction I. The characteristics of the "Mylar" film and the aluminum layer are the same as Construction I. The P-type silicon layer was prepared by vapor coating. The N-type zinc oxide layer was prepared from a slurry.

The silicon layer was applied to the aluminum layer as follows:

The vapor coating of silicon was accomplished in a 20 inch diameter experimental bell jar. The samples to be vapor coated were mounted on a rotating cage approximately 16 inches from the outgassed evaporating source. The source was a tantalum boat with dimensions of 1⅞ inch x ⅞ inch x 0.15 inch. The bell jar was previously exhausted to approximately $10^{-5}$ mm. of mercury, and the tantalum boat was outgassed at approximately 2000° C. for 5 minutes, then cooled in vacuum for 30 minutes prior to coating.

The jar was opened, and freshly cleaved silicon particles were placed in the outgassed tantalum boat. The silicon particles were obtained from crushed P-type single crystal silicon. The silicon particles were cleaned by etching, rinsing in alcohol, followed by drying to remove surface oxide before vapor coating. The aluminum base samples to be coated were placed on the rotatable cage and the jar evacuated. The glow discharge was turned on for 10 minutes at this point, while the pressure was kept at 10–20 microns by a controlled leak-needle valve. Then the system was pumped to approximately $0.3 \times 10^{-5}$ mm. of mercury, and the rotating cage was turned on to facilitate a consistent coat. The heating source was raised to temperature by setting the current indicating meter reading of 9.0 amperes. The substrate was not heated, but remained at the residual bell jar temperature. Coating thicknesses ranging between 10 and 50 percent transmission (using a tungsten light source) could be made. The thickness was monitored during coating and was maintained to ±3 percent transmission of a selected point between 10 and 50 percent. It was determined that the coated layer was P-type by thermoelectric measurements, and the surface resistance was about $10^2$ to $10^3$ ohms per square.

The zinc oxide layer was prepared and applied in the same manner as described in connection with Construction I. This top layer of zinc oxide overlying the silicon layer had the same characteristics and properties as described regarding the zinc oxide layer of Construction I.

Construction VIII

Construction VIII comprised the following successive layers: a "Mylar" film backing, an aluminum foil layer overlying and attached to said "Mylar" backing, an N-type zinc oxide layer overlying and attached to said aluminum layer, and a P-type silicon top layer overlying and attached to said zinc oxide layer. This construction was substantially the same as Construction VII, except that the zinc oxide layer and the P-type silicon layer were reversed. The layers were applied and had the same general characteristics as the corresponding layers in Construction VII.

Construction IX

Construction IX comprised a "Mylar" film backing, an aluminum foil layer overlying and attached to said "Mylar" backing, a P-type indium antimonide layer overlying and attached to said aluminum layer, an N-type zinc oxide layer overlying and attached to said indium antimonide layer, and a P-type indium antimonide top layer overlying and attached to said N-type zinc oxide layer. This construction was substantially the same as Construction I, except that a P-type indium antimonide layer was applied over the zinc oxide top layer of Construction I. All the layers were applied and had substantially the same characteristics as described in Construction I. The last indium antimonide layer was applied in the same manner as the first indium antimonide layer and had substantially the same characteristics as the top indium antimonide layer of Construction II.

CONTROL

The control samples were prepared in the same manner as described in the related constructions, except that only one semiconductive or photoconductive layer was utilized in the construction. The various layers and the manner of preparation of the control construction were substantially the same as described in the previous constructions. The control samples, therefore, had a "Mylar" backing, an aluminum layer attached and overlying said "Mylar" backing, and a zinc oxide, or a cadmium sulfide, or an indium oxide top layer overlying and attached to said aluminum layer. The top photoconductive layer was applied from a slurry.

The speed sensitivity and other characteristics of Constructions I through IX and the control samples were tested by the following dry test method:

The aluminum layer served as one electrode of the test cell, and a transparent "NESA" glass plate served as the other electrode. The construction to be tested was cut to 1 inch square and placed in a dark test container, and a reverse bias direct current of 30 volts was applied to the electrodes. The aluminum layer was the anode when N-type semiconductive layers were deposited thereon, and was the cathode when P-type semiconductive layers were deposited thereon. The "NESA" glass plate was laid flat over the entire outer surface or top layer of the construction to be tested, e.g., over the zinc oxide layer, or indium antimonide layer, etc. The sample was exposed to 10 foot-candles (incident) of tungsten light (150 watts) directed through an optical system at the "NESA" glass electrode for 1 second. The change in conductance with time was followed on a strip recorder. The values of these tests are shown in Table I below. The measurements are light conductance ($\sigma_L$), dark conductance ($\sigma_D$),

TABLE I

| Construction No. | Control | Composition Layer 1st | Composition Layer 2nd | Pole of Al Layer | $\sigma_D$(mhos) | $\sigma_L$(mhos) | Response rate (mhos/sec.) | Light Transmission Through InSb Layer |
|---|---|---|---|---|---|---|---|---|
| | (ZnO) | | | − | $6.5\times10^{-7}$ | $1,800\times10^{-7}$ | $83\times10^{-7}$ | |
| I | | InSb | ZnO | − | $8\times10^{-7}$ | $3,000\times10^{-7}$ | $1,000\times10^{-7}$ | |
| II | | ZnO | InSb | + | $25\times10^{-7}$ | $2,600\times10^{-7}$ | $200\times10^{-7}$ | 40%. |
| | (CdS) | | | − | $0.17\times10^{-9}$ | $30\times10^{-9}$ | $15\times10^{-9}$ | |
| III | | InSb | CdS | − | $1.0\times10^{-9}$ | $60\times10^{-9}$ | $120\times10^{-9}$ | |
| IV | | CdS | InSb | + | $1.3\times10^{-9}$ | $50\times10^{-9}$ | $80\times10^{-9}$ | 30%. |
| | ($In_2O_3$) | | | − | $20\times10^{-7}$ | $500\times10^{-7}$ | $20\times10^{-7}$ | |
| V | | InSb | $In_2O_3$ | − | $15\times10^{-7}$ | $650\times10^{-7}$ | $150\times10^{-7}$ | |
| VI | | $In_2O_3$ | InSb | + | $22\times10^{-7}$ | $590\times10^{-7}$ | $50\times10^{-7}$ | 40%. |
| | (ZnO) | | | − | $5.0\times10^{-7}$ | $1,600\times10^{-7}$ | $70\times10^{-7}$ | |
| VII | | Si | ZnO | − | $1.0\times10^{-7}$ | $3,200\times10^{-7}$ | $1,100\times10^{-7}$ | |
| VIII | | ZnO | Si | + | $1.8\times10^{-7}$ | $2,400\times10^{-7}$ | $250\times10^{-7}$ | 30% through Si layer. |
| | (ZnO) | | | − | $6\times10^{-7}$ | $1,200\times10^{-7}$ | $33\times10^{-7}$ | |
| IX | | InSb ZnO* | InSb | + or − | $8\times10^{-7}$ | $1,800\times10^{-7}$ | $60\times10^{-7}$ | 4% through InSb and ZnO layers. |

*Intermediate or middle layer of 3-layer construction.

time of start of the light projection ($t_1$), time of measurement ($t_2$) and time that the light was turned off ($t_3$). The sensitivity of the construction corresponds to $\sigma_L-\sigma_D$. The response rate corresponds to $$\frac{\sigma_L-\sigma_{t_2}}{t_2}$$

For tests, $t_2$ was $\frac{1}{10}$ second.

The decay rate after the light was turned off is not shown in the table because it is substantially the same as the control samples, the decay rate being $\sigma_L-\sigma_D$ at a specified time after the light was turned off.

Each of these constructions was also exposed to a projected light image and electrolytically developed with an aqueous electrolytic solution. A reverse bias was used during exposure and was continued without interruption from exposure through the electrolytic development. On development, the aluminum layer constituted an electrode connected to the direct current source. Exposure time was approximately 1 second during the projection of a black and white transparency on to the constructions from a conventional 150 watt projector. Both exposure and development were carried out while the receptor was inserted in an aqueous electrolytic cell. The voltage of the direct current was about 50 volts, and the current applied in accordance with the construction was approximately 15 milliamperes. A dense black image on a white bacnground was formed in the light struck areas with N-type top layers using a silver nitrate thiourea aqueous solution. With P-type top layers, a white image on a black background was formed using a negatively charged white latex as the electrolytic developer solution. Such a latex is one of "Pliolite" SX7 (a copolymer of styrene and butadiene) suspended in water in an amount of about 30 percent by weight and containing an electrolyte.

The receptor sheets of this invention have also been used as a film in a camera. Pictures have been taken with the receptor sheets using a No. 11 flash bulb and an *f*5.6 opening with good results. The electrolytic cell formed a part of the camera.

The use of an electrolytic cell may be eliminated and replaced with a sponge containing aqueous electrolyte and developer which is wiped over the surface during development. The sponge is connected to the current source in the conventional manner. For this type of development, the top layer must be sufficiently conductive to pass a current laterally across the surface. Many semiconductors have sufficient conductivity for this purpose even under dark conditions as previously mentioned. When the surface of the receptor has sufficient conductance, one of the poles of the current source is also connected to the top layer. Exposure is carried out as a separate step which is then followed by a development step. In this way, the reverse bias potential can be maintained on the receptor during the entire procedure including both exposure and development.

In general, the receptor sheets of this invention have an over-all thickness of about 1 to about 10 mils. The slurry coated layers of photoconductors are usually in a thickness of about 0.5 to about 1.0 mil when dry, and the vapor deposited layers usually have a thickness of about 1000 to about 10,000 angstroms. The size of the sheet is determined by the purpose for which it is to be used, such as a film, print, etc. For example, the size may correspond to 35 mm. film, or smaller, or as large as 8½ inches x 11 inches, or larger. The total resistance of the sheet in the transverse direction is usually between about 104 and about 109 ohms per square inch in the dark (dark adapted). The top layer of photoconductor is deposited substantially coextensively over the sublayer of photoconductor. When this top layer is nonphotoconductive, actinic light should penetrate to at least to the diffusion length of the plane junction. The transverse resistance of the vapor coated layer is substantially less than the slurry coated layer in most instances because of the difference in thickness and is therefore usually not a factor in the over-all transverse resistance of the receptor. The reverse bias potential and current utilized during the exposure is similar in values to that employed during the development, but may be somewhat higher if desired.

Various modifications of layer construction may be employed without departing from the scope of this invention. Also, various techniques of exposure and development may become obvious to those skilled in the art without departing from the scope of this invention.

Having described our invention, we claim:

1. In a process for making an electrographic reproduction, the improvement which comprises exposing to electromagnetic radiation a photoconductive sheet comprising an electrically conductive layer, a first semiconductive layer overlying and attached to said conductive layer, and a second semiconductive layer substantially coextensively overlying and attached to said first semiconductive layer forming a plane junction therebetween, one of said semiconductive layers being N-type and the other of said semiconductive layers being P-type, and during said exposure maintaining a reverse bias direct current field on said sheet with respect to said junction.

2. A process for making a reproduction which comprises exposing to an electromagnetic radiation image a photoconductive sheet comprising an electrically conductive layer, a first semiconductive layer overlying and attached to said conductive layer, and a second semiconductive layer substantially coextensively overlying and attached to said first semiconductive layer forming a plane junction therebetween, one of said semiconductive layers being N-type and the other of said semiconductive layers being P-type, during said exposure maintaining a reverse bias direct current field on said sheet with respect to said junction and developing the exposed sheet while under said field to produce a reproduction of said radiation image.

3. The process of claim 2 in which said first semiconductive layer is of the P-type and the conductive layer is the cathode during exposure and development.

4. The process of claim 2 in which said first semiconductive layer is of the N-type and the conductive layer is the anode during exposure and development.

5. A process for making a reproduction which comprises exposing to a light image a photoconductive copysheet comprising a metal layer, a first semiconductive layer overlying and attached to said metal layer, and a second semiconductive layer substantially coextensively overlying and attached to said first semiconductive layer forming a P–N plane junction therebetween which is accessible to light, one of said semiconductive layers being N-type and the other of said semiconductive layers being P-type, at least one of said semiconductive layers being photoconductive, during said exposure maintaining a reverse bias direct current electrical field on said copysheet with respect to said junction and electrolytically developing the exposed copysheet with an aqueous electrolytic solution as a surface electrode on the exposed surface thereof to produce a reproduction of said light image.

6. The process of claim 5 in which said first semiconductive layer is of the P-type and the metal layer is connected to the negative pole of a direct current source during exposure and development.

7. The process of claim 5 in which said first semiconductive layer is of the N-type, the metal layer is connected to the positive pole of a direct current source during exposure and development, and the electrolytic solution is an aqueous latex containing negatively charged polymer particles.

8. The process of claim 5 in which said first semiconductive layer is of the N-type, the metal layer is connected to the positive pole of a direct current source during exposure and development, and the electrolytic solution is a hydrosol containing a dye.

9. The process of claim 5 in which said first semiconductive layer is of the N-type, the metal layer is connected to the positive pole of a direct current source during exposure and development, and an oxidizable dye is in contact with the exposed surface.

10. The process of claim 5 in which said first semiconductive layer is of the N-type, the metal layer is connected to the positive pole of a direct current source during exposure and development, and the electrolytic solution contains an acid-type dye having a colored anion.

References Cited

UNITED STATES PATENTS

| | | | |
|---|---|---|---|
| 3,010,883 | 11/1961 | Johnson et al. | 204—18 |
| 3,041,166 | 6/1962 | Bardeen | 96—1.5 |
| 3,127,331 | 3/1964 | Neher | 204—18 |
| 3,172,828 | 3/1965 | Shepard et al. | 96—1.5 X |
| 3,247,081 | 4/1966 | Reithel | 204—18 |

NORMAN G. TORCHIN, *Primary Examiner.*

C. E. VAN HORN, *Assistant Examiner.*

UNITED STATES PATENT OFFICE

CERTIFICATE OF CORRECTION

Patent No. 3,410,767 November 12, 1968

Joseph W. Shepard et al.

It is certified that error appears in the above identified patent and that said Letters Patent are hereby corrected as shown below:

Column 3, line 51, "such as synthetic" should read -- such as paper or synthetic --. Column 13, line 51, "SX7" should read -- S-7 --. Column 14, line 29, "104" and "109" should read -- $10^4$ -- and -- $10^9$ --.

Signed and sealed this 10th day of March 1970.

(SEAL)
Attest:

Edward M. Fletcher, Jr.
Attesting Officer

WILLIAM E. SCHUYLER, JR.
Commissioner of Patents